United States Patent [19]

Denlinger et al.

[11] 4,177,916
[45] Dec. 11, 1979

[54] SOLDERING METHOD AND SOLDER JOINT

[75] Inventors: Michael C. Denlinger, Anaheim; Robert W. Korb, Fountain Valley; Vernon F. Lardenoit, Diamond Bar, all of Calif.

[73] Assignee: Hughes Aircraft Company, Culver City, Calif.

[21] Appl. No.: 912,894

[22] Filed: Jun. 5, 1978

Related U.S. Application Data

[62] Division of Ser. No. 858,491, Dec. 8, 1977, abandoned.

[51] Int. Cl.² ........................ B23K 1/02; B23K 35/26
[52] U.S. Cl. ................................ 228/231; 228/238; 228/263; 428/674
[58] Field of Search ............... 228/263, 198, 238, 231; 428/674, 675; 427/379, 380, 383; 75/151, 166 R, 166 C

[56] References Cited

U.S. PATENT DOCUMENTS

| | | | |
|---|---|---|---|
| 1,333,619 | 3/1920 | Hill | 75/151 |
| 2,102,998 | 12/1937 | Darby et al. | 75/151 |
| 2,372,745 | 4/1945 | Smith, Jr. | 75/166 C |
| 2,945,296 | 7/1960 | Jones et al. | 228/224 X |
| 3,411,961 | 11/1968 | Harvey | 228/231 X |
| 3,733,182 | 5/1973 | Crossland et al. | 75/151 X |

*Primary Examiner*—Francis S. Husar
*Assistant Examiner*—K. J. Ramsey
*Attorney, Agent, or Firm*—Allen A. Dicke, Jr.; W. H. MacAllister

[57] ABSTRACT

Soldering method comprises placing a cadmium-zinc-lead solder on a copper base and exposing the solder joint to about 200° C. for at least one hour to produce a copper-cadmium-zinc ternary interface barrier layer which inhibits migration.

7 Claims, 3 Drawing Figures

SOLDERING METHOD AND SOLDER JOINT

The government has rights in this invention pursuant to Contract No. F33615-76-C-5089 awarded by the Department of the Air Force.

CROSS REFERENCE

This is a division of patent application Ser. No. 858,491 filed Dec. 8, 1977, abandoned, for "SOLDER".

BACKGROUND OF THE INVENTION

This invention is directed to a soldering method by which metals can be joined for electrical and mechanical purposes. This soldering method includes the use of a lead-cadmium-zinc solder.

Conventional tin-lead solder has been almost exclusively used in the electronics industry for many years. In spite of its many advantages and universal usage, it has some significant disadvantages. In addition to its high cost, which has been rapidly increasing in the past few years, it has limited resistance to thermal fatigue. Many instances of solder joint cracking have been observed. While some of these instances may be attributed to design deficiencies, it would be advantageous to have a solder which is more resistant to thermal fatigue. Furthermore, recent developments in polyimide materials have made it possible to extend the upper temperature limit of printed wiring boards beyond the range of eutectic tin-lead solder. Presently, polyimide printed wiring boards are only used for their manufacturing advantages including having less tendency to smear during drilling and less tendency to craze during rework, but their high temperature capability may be employed in the future. The use of the present lead-cadmium-zinc solder of this invention is compatible with polyimide printed wiring boards including its higher temperature capability and provides economy and reliability on boards of all materials.

SUMMARY OF THE INVENTION

In order to aid in the understanding of this invention, it can be stated in essentially summary form that it is directed to a method which includes the use of a lead-cadmium-zinc solder alloy having between 0.5 and 1.0 percent zinc, between 0.5 and 17 weight percent cadmium, and the balance lead to make a solder joint on a copper base, followed by heat treatment to form a copper-cadmium-zinc ternary interface barrier layer.

It is thus an object of this invention to provide a solder which is resistant to thermal fatigue type failures. It is another object to provide a solder which is compatible with the higher temperature limits of polyimide printed wiring boards. It is a further object to provide a solder which is inexpensive. It is another object to provide a solder which is capable of soldering the common materials found in electronic circuitry and other equipment where solder attachment is desired. It is another object to provide a solder which is compatible with wave soldering and reflow soldering techniques and which is compatible with other present day soldering methods and operations.

Other objects and advantages of this invention will become apparent from a study of the following portion of the specification, the claims and the attached drawings.

DESCRIPTION OF THE PREFERRED EMBODIMENT

Figure 1:
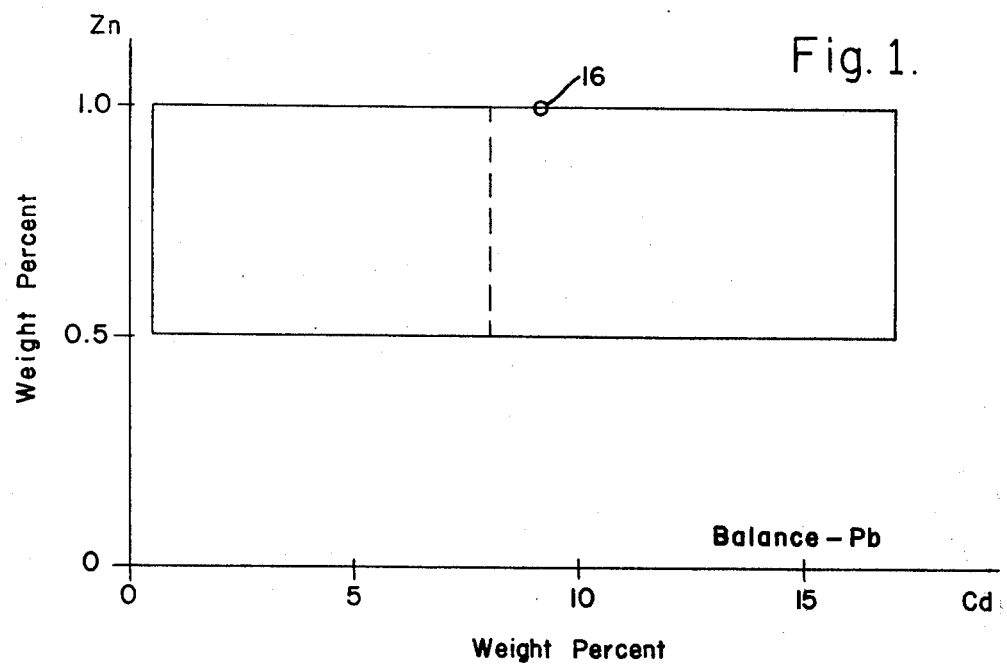
FIG. 1 is a graph showing the relative proportions of the constituents of the present solder alloy.

As illustrated in FIG. 1, the solder alloy of this invention is composed of between 0.5 and 1.0 weight percent zinc, between 0.5 and 17 weight percent cadmium, with the balance being lead. In the following description of the reasons and functions of these limits, it is further defined that the more preferred minimum value of cadmium is about 8 weight percent. This is illustrated in FIG. 1 by the dotted line across the full rectangle of the preferred alloy ranges. The right hand rectangle thus becomes the more preferred practical limit of alloy composition range.

The primary lead constituent promotes superior elevated temperature strength properties and provides for ductility. Under normal conditions lead does not form intermetallic compounds with copper or gold base materials and is therefore not associated with brittle interface failures.

The secondary cadmium constituent provides for good solderability and electrical conductivity properties. The upper limit of cadmium indicated 17 percent in FIG. 1 is chosen because of the toxicity of cadmium. When a cadmium constituent percentage exceeds about 17 percent, toxicity becomes more of a problem. Furthermore, more cadmium will increase the melting temperature of the solder alloy. Accordingly, 17 percent cadmium is considered to be a good practical upper limit for the solder alloy.

For purposes of increasing the corrosion resistance properties, one to two percent of silver may be added to the alloy. Since the addition of silver is cost effective and is only needed for corrosion resistance purposes, its use may not be needed.

Figure 2:
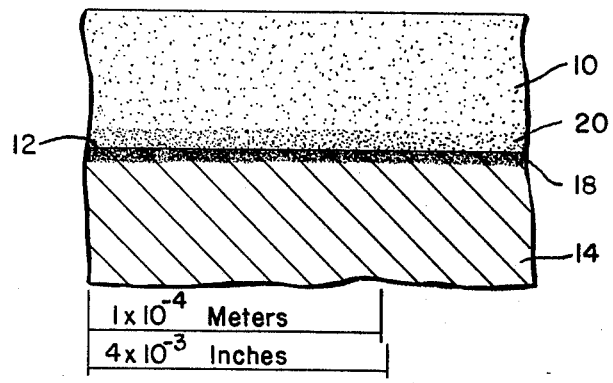
FIG. 2 is a drawing taken from a micrograph of a solder joint made with a solder of this invention after thermal cycling.

Cadmium is a component element in the $Cu_3Cd_3Zn_4$ ternary intermetallic compound which forms layer 12 beneath the solder layer 10 shown in FIG. 2. In FIG. 2, base metal 14 to which the solder is applied is copper. FIG. 2 was an approximately 500 times magnification in the original patent drawings and the scale of the figure is indicated thereon. Since cadmium is a component element in the $Cu_3Cd_3Zn_4$ ternary intermetallic compound, it must be present in sufficient quantity so that the $Cu_3Cd_3Zn_4$ intermetallic compound barrier layer 12 can form on the copper surface of the base 14 during high temperature exposure. For the reason that there is need to form this layer, 0.5 weight percent cadmium is the lower limit of the cadmium constituent. However, for the reason that cadmium improves solderability by improving wetting of the solder alloy, more cadmium than the 0.5 percent is helpful for solderability reasons. Thus, FIG. 1 illustrates the more preferred minimum limit for cadmium at 8 weight percent. Above that value, solderability is satisfactory.

The tertiary zinc constituent also promotes improved solderability and electrical conductivity properties. It is necessary that the zinc content be maintained within the approximate limits of 0.5 to 1.0 weight percent so that the solid state ternary reaction with copper is assured of being sufficient to form the $Cu_3Cd_3Zn_4$ intermetallic compound barrier layer 12 but low enough in zinc content to prevent excessive $Cu_3Cd_3Zn_4$ barrier layer formation. The zinc constituent serves as the controlling agent that governs and limits the $Cu_3Cd_3Zn_4$ interface reaction with the copper base and it is therefore considered to be the key element in controlling the interface layer. It is the character and thickness of this barrier layer 12 that is responsible for the resulting superior thermal fatigue and elevated temperature properties.

Figure 3:
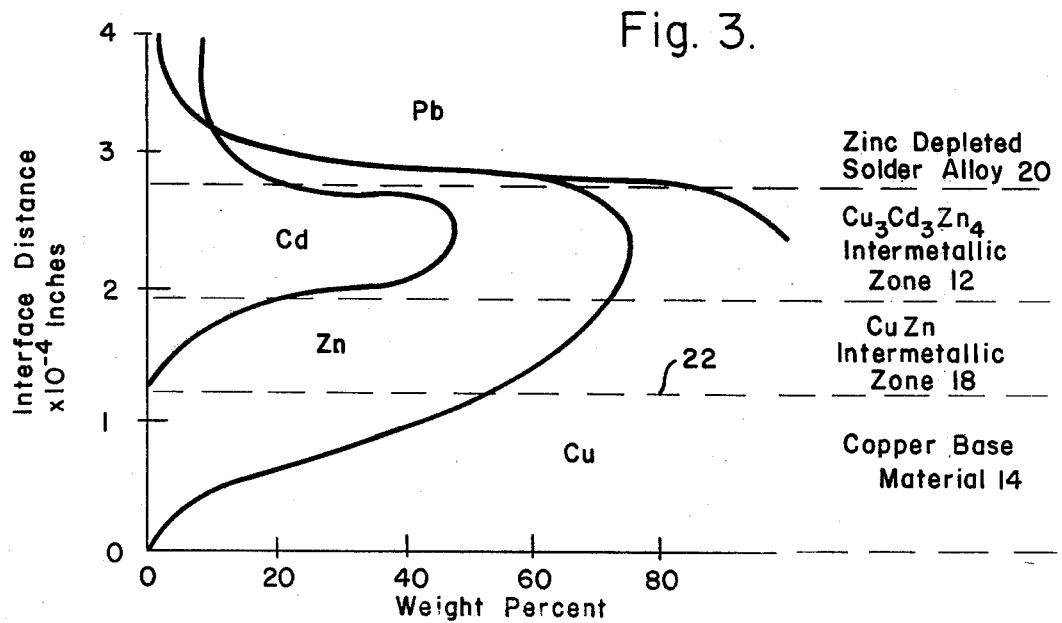
FIG. 3 is a chemical gradient diagram which illustrates the individual element composition at any point in a typical copper-solder interface.

The particular solder alloy shown in FIGS. 2 and 3 is the alloy indicated at point 16 in FIG. 1. That alloy is 9 weight percent cadmium, 1 weight percent zinc and the 90 weight percent balance is lead. The solder alloy of that composition has a liquidus temperature of 260° C., and produces solder joints of good room temperature strength, excellent elevated temperature (200° C.) strength, good electrical conductivity and solderability to copper and to gold plated Kovar (a glass sealing alloy of 55% Fe, 28% Ni and 17% Co).

The solder on those surfaces was thermally fatigue tested. Each cycle of the thermal fatigue test comprised 200° C. for 22 minutes, followed by 20° C. for 4 minutes and −55° C. for 10 minutes and 20° C. for 4 minutes. Five hundred cycles of this thermal fatigue test revealed that the solder alloy indicated at point 16 is completely resistant to thermal cycling fatigue-type failures.

On the other hand, the conventional eutectic tin-lead solder alloy cracked after 200 cycles of thermal fatigue testing. In that test, since the eutectic tin-lead solder melts at 183° C., the hot station was maintained at 125° C. during thermal cycling. A 90 weight percent lead and 10 weight percent tin solder alloy was also found to produce fatigue cracks after 10 cycles (with the hot station maintained at 200° C.).

The advantagous thermal fatigue properties exhibited by the alloy of this invention, and particularly the alloy indicated at point 16 in FIG. 1 are attributed to the ductile nature of the alloy itself and the ability to form and maintain the chemically inert solder interface barrier layer 12 with copper base metal 14. Scanning electron microscope (SEM) X-ray analysis reveals the wetting action of the solder on a copper base to be the formation of CuZn intermetallic compound. The top surface of the original copper base is indicated at 22. Since time at temperature during soldering is minimal and the zinc content of the alloy is relatively low, the resulting CuZn intermetallic layer was found to be very thin at the copper-solder interface. During high temperature exposure (200° C. for a one hour minimum duration), the CuZn intermetallic layer may be totally or at least partially converted to the $Cu_3Cd_3Zn_4$ layer through a solid state reaction. This ternary interface reaction terminates when the solder alloy immediately adjacent to the copper base is thoroughly depleted of the zinc constituent. Once the ternary reaction is complete, the resulting $Cu_3Cd_3Zn_4$ intermetallic compound layer serves as a barrier thereby precluding the formation of any binary cadmium-copper intermetallic compounds. Therefore, the limitation on the zinc constituent provides the solder alloy of this invention with its own built-in mechanism for terminating these solid state intermetallic compound chemical reactions with copper base materials. By controlling the solid state formation of the $Cu_3Cd_3Zn_4$ barrier layer, the solder-copper interface is ultimately rendered chemically inert and is therefore immune to failures associated with excessive formation of brittle intermetallic compounds. Since the solder of this invention is chemically inert at elevated temperatures by reason of this barrier layer, long-term solder alloy degradation is totally avoided. FIG. 3 shows a typical SEM chemical gradient diagram taken across a solder-copper interface. The chemistry at any given point on a line traversing the solder interface is obtained by combining the net weight percent value of each elemental region (totaling 100%). The $Cu_3Cd_3Zn_4$ chemistry is shown to remain constant across a net interface distance of $8 \times 10^{-5}$ inches (point 12 in FIG. 2). The $Cu_3Cd_3Zn_4$ phase zone is shown to be $8 \times 10^{-5}$ inches thick while the CuZn phase zone has diminished to $5 \times 10^{-5}$ inches. Therefore, during high temperature exposure, the cadmium in the solder alloy combines with the CuZn phase that previously formed during soldering to ultimately form the $Cu_3Cd_3Zn_4$ barrier phase. It is this thin ternary intermetallic compound barrier layer that precludes any subsequent cooper-cadmium binary intermetallic compound reactions from occurring. Once this barrier layer has formed, the solder interface is rendered chemically inert.

This invention having been described in its preferred embodiment, it is clear that it is susceptible to numerous modifications and embodiments without the exercise of the inventive faculty and accordingly the scope of this invention is defined by the scope of the following claims.

We claim:

1. The method of joining a metal part to a cooper base by soldering comprising:
   placing a melted solder alloy consisting essentially of zinc substantially within the range of 0.5 to 1.0 weight percent, cadmium substantially within the range of 8 to 17 weight percent and lead as a balance constituent between a metal part and a copper base material and permitting it to solidify to form a copper-zinc intermetallic layer at the juncture of the solder alloy layer and the copper base material; and
   exposing the soldered copper base material with its solder layer and attached metal part to about 200° C. for at least one hour to at least partially convert the copper-zinc intermetallic layer to a copper-cadmium-zinc ternary interface layer.

2. The method of claim 1 wherein the conversion is at least partially to a substantially $Cu_3Cd_3Zn_4$ interface layer.

3. The method of claim 1 further including the step of including silver substantially within the range of 1.0 and 2.0 weight percent in the original solder alloy to increase corrosion resistance of the solder alloy.

4. The method of joining a metal part to a copper base by soldering comprising the steps of:
   forming a solder alloy consisting essentially of zinc substantially within the range of 0.5 to 1.0 weight percent, cadmium substantially in the range of 8 to 17 weight percent and lead as the balance constituent;
   melting the solder alloy between a metal part and a copper base material to form a solder layer attaching the metal part to the copper base material and permitting the solder alloy to solidify on the copper base material to form an intermediate zone substantially of copper-zinc binary alloy; and
   heating the solder attached metal part and the copper base material with its solder layer to at least about 200° C. for at least one hour to at least partially convert the copper-zinc binary layer to a copper-cadmium-zinc ternary interface layer so that the ternary interface layer acts as a barrier layer to prevent metallic migration to prevent the excessive formation of brittle intermetallic compounds to inhibit the production of thermal-cycling fatigue cracking.

5. The method of claim 4 wherein the conversion is at least partially to a $Cu_3Cd_3Zn_4$ interface layer.

6. A solder joint made in accordance with the method of claim 5.

7. A solder joint made in accordance with the method of claim 1.

* * * * *